(12) United States Patent
Nagata (10) Patent No.: US 9,972,745 B2
(45) Date of Patent: May 15, 2018

(54) GROUP III NITRIDE SEMICONDUCTOR LIGHT-EMITTING DEVICE

(71) Applicant: TOYODA GOSEI CO., LTD., Kiyosu-shi (JP)

(72) Inventor: Kengo Nagata, Kiyosu (JP)

(73) Assignee: TOYODA GOSEI CO., LTD., Kiyosu-Shi, Aichi-Ken (JP)

(*) Notice: Subject to any disclaimer, the term of this patent is extended or adjusted under 35 U.S.C. 154(b) by 0 days. days.

(21) Appl. No.: 15/409,042

(22) Filed: Jan. 18, 2017

(65) Prior Publication Data

US 2017/0213936 A1 Jul. 27, 2017

(30) Foreign Application Priority Data

Jan. 26, 2016 (JP) .................................. 2016-012756

(51) Int. Cl.
| | |
|---|---|
| *H01L 33/00* | (2010.01) |
| *H01L 33/32* | (2010.01) |
| *H01L 33/06* | (2010.01) |
| *H01L 33/22* | (2010.01) |
| *H01L 33/24* | (2010.01) |

(52) U.S. Cl.
CPC .......... *H01L 33/0025* (2013.01); *H01L 33/06* (2013.01); *H01L 33/22* (2013.01); *H01L 33/24* (2013.01); *H01L 33/32* (2013.01)

(58) Field of Classification Search
None
See application file for complete search history.

(56) References Cited

U.S. PATENT DOCUMENTS

| | | | |
|---|---|---|---|
| 6,329,667 B1 * | 12/2001 | Ota | H01L 33/02 257/103 |
| 7,446,345 B2 | 11/2008 | Emerson et al. | |
| 2014/0084241 A1 | 3/2014 | Okuno et al. | |
| 2014/0154828 A1 * | 6/2014 | Mukono | H01L 33/007 438/46 |
| 2015/0236193 A1 * | 8/2015 | Aoki | H01L 33/007 438/47 |
| 2016/0260868 A1 | 9/2016 | Saito et al. | |
| 2016/0380155 A1 * | 12/2016 | Jeong | H01L 33/22 257/101 |
| 2017/0186912 A1 * | 6/2017 | Inoue | H01L 33/32 |

FOREIGN PATENT DOCUMENTS

| | | |
|---|---|---|
| JP | 2008-539585 A | 11/2008 |
| WO | WO 2006/118623 A1 | 11/2006 |

* cited by examiner

*Primary Examiner* — Joseph Schoenholtz
(74) *Attorney, Agent, or Firm* — McGinn IP Law Group, PLLC (57) ABSTRACT

The present invention provides a Group III nitride semiconductor light-emitting device in which electrons and holes are suppressed from being captured by threading dislocation, and a production method therefor. The light-emitting device comprises an n-type contact layer, an n-side electrostatic breakdown preventing layer, an n-side superlattice layer, a light-emitting layer, a p-type cladding layer, a p-type contact layer, a transparent electrode, an n-electrode, and a p-electrode. The light-emitting device has a plurality of pits extending from the n-type semiconductor layer to the p-type semiconductor layer. The n-side electrostatic breakdown preventing layer has an n-type AlGaN layer. The n-type AlGaN layer includes starting points of the pits.

18 Claims, 10 Drawing Sheets

GROUP III NITRIDE SEMICONDUCTOR LIGHT-EMITTING DEVICE

BACKGROUND OF THE INVENTION

Field of the Invention

The present invention relates to a Group III nitride semiconductor light-emitting device and a production method therefor, more specifically, to a method for producing a Group III nitride semiconductor light-emitting device having pits.

Background Art

A Group III nitride semiconductor light-emitting device comprises a light-emitting layer which emits light through recombination of electrons and holes, an n-type semiconductor layer, and a p-type semiconductor layer. When producing the Group III nitride semiconductor light-emitting device, a semiconductor layer is epitaxially grown on a substrate. In this case, threading dislocation occurs in the semiconductor layer due to lattice mismatch between the substrate and the semiconductor layer. In the threading dislocation, non-radiative recombination of electrons and holes occurs. Non-radiative recombination refers to a recombination of electrons and holes which generates not light but heat. Therefore, electrons existing in the vicinity of the threading dislocation may cause non-radiative recombination at the threading dislocation. The more frequently non-radiative recombination occurs, the more heat the semiconductor light-emitting device generates. The emission efficiency of the semiconductor light-emitting device is decreased by the amount of the generated heat.

Accordingly, the techniques have been developed to suppress non-radiative recombination in the threading dislocation. For example, Japanese Translation of PCT International Application Publication No. 2008-539585 discloses that pits originated from threading dislocation are generated from the superlattice structure 16 or the GaN layer 12 (refer to paragraphs [0059], [0073], and FIGS. 1 and 2). The superlattice structure 16 has an InGaN/GaN structure. Existence of such pits improves the luminance or the electrostatic discharge resistance of light-emitting device (refer to paragraphs [0042] to [0043]).

In this way, the light output of the semiconductor light-emitting device has been improved through research and development. However, to improve the light output, it is required that electrons and holes are not further captured by threading dislocation.

SUMMARY OF THE INVENTION

The present invention has been conceived to solve the foregoing problems in the prior art. It is therefore an object of the present invention to provide a Group III nitride semiconductor light-emitting device in which electrons and holes are suppressed from being captured by threading dislocation, and a production method therefor.

In a first aspect of the present invention, there is provided a Group III nitride semiconductor light-emitting device comprising an n-type semiconductor layer, a light-emitting layer on the n-type semiconductor layer, and a p-type semiconductor layer on the light-emitting layer. The Group III nitride semiconductor light-emitting device has a plurality of pits extending from the n-type semiconductor layer to the p-type semiconductor layer. The n-type semiconductor layer includes a first n-type AlGaN layer including starting points of the pits.

In the Group III nitride semiconductor light-emitting device, the starting points of the pits are disposed in the first n-type AlGaN layer. The first n-type AlGaN layer is a semiconductor layer with a higher resistivity than that of GaN layer. Therefore, carriers are difficult to be captured by a plurality of pits, that is, carriers are difficult to be captured by threading dislocation being a defect. Thereby, non-radiative recombination can be suppressed in the threading dislocation.

A second aspect of the present invention is directed to a specific embodiment of the Group III nitride semiconductor light-emitting device, wherein the n-type semiconductor layer includes an n-side electrostatic breakdown preventing layer. The n-side electrostatic breakdown preventing layer has a first n-type AlGaN layer. The light-emitting layer has a barrier layer. The Al composition ratio of the first n-type AlGaN layer is higher than that of the barrier layer. The first n-type AlGaN layer has an energy barrier higher than that of the conventional potential energy barrier in the pit. That is, in the Group III nitride semiconductor light-emitting device, the first n-type AlGaN layer serves as a carrier blocking layer. Therefore, the carriers of the light-emitting layer hardly leak to the n-type semiconductor layer.

A third aspect of the present invention is directed to a specific embodiment of the Group III nitride semiconductor light-emitting device, wherein the n-type semiconductor layer includes a semiconductor layer comprising an n-type GaN layer, a first n-type AlGaN layer, an ud-AlGaN layer, an ud-GaN layer, and an n-type GaN layer formed in this order on the side far from the light-emitting layer.

A fourth aspect of the present invention is directed to a specific embodiment of the Group III nitride semiconductor light-emitting device, wherein the n-type semiconductor layer includes a semiconductor layer comprising an n-type GaN layer, a first n-type AlGaN layer, an n-type AlInGaN layer, an ud-AlInGaN layer, an ud-InGaN layer, an ud-GaN layer, and an n-type GaN layer formed in this order on the side far from the light-emitting layer. A potential barrier is formed by the In-doped of the n-type AlInGaN layer. Therefore, the existence probability of electrons and holes is low in the vicinity of threading dislocation. Non-radiative recombination is further suppressed in the threading dislocation. Moreover, the surface flatness of the semiconductor layer is improved by the surfactant effect of In atoms. Thereby, the semiconductor light-emitting device exhibiting superior emission efficiency is achieved.

A fifth aspect of the present invention is directed to a specific embodiment of the Group III nitride semiconductor light-emitting device, wherein the n-type semiconductor layer includes a semiconductor layer comprising an n-type GaN layer, a first n-type AlGaN layer, an n-type AlInGaN layer, an n-type InGaN layer, an ud-InGaN layer, an ud-GaN layer, and an n-type GaN layer formed in this order on the side far from the light-emitting layer. A potential barrier is formed by the In-doped of the n-type AlInGaN layer. Therefore, the existence probability of electrons and holes is low in the vicinity of threading dislocation. Non-radiative recombination is further suppressed in the threading dislocation. Moreover, the surface flatness of the semiconductor layer is improved by the surfactant effect of In atoms, thereby achieving the semiconductor light-emitting device exhibiting superior emission efficiency.

A sixth aspect of the present invention is directed to a specific embodiment of the Group III nitride semiconductor light-emitting device, wherein the thickness of the first n-type AlGaN layer is in a range of 1 nm to 130 nm. In this case, the Group III nitride semiconductor light-emitting device exhibits a high yield rate in the electrostatic discharge test.

In a seventh aspect of the present invention, there is provided a method for producing a Group III nitride semiconductor light-emitting device comprising an n-type semiconductor layer, a light-emitting layer on the n-type semiconductor layer, a p-type semiconductor layer on the light-emitting layer. A first n-type AlGaN layer is formed as one of the n-type semiconductor layer. A plurality of pits is formed so as to extend from the n-type semiconductor layer to the p-type semiconductor layer with the first n-type AlGaN layer as a starting point.

An eighth aspect of the present invention is directed to a specific embodiment of the method for producing a Group III nitride semiconductor light-emitting device, wherein an n-side electrostatic breakdown preventing layer is formed as at least one of the n-type semiconductor layer. A first n-type AlGaN layer is formed as at least one of the n-side electrostatic breakdown preventing layer. A barrier layer containing Al and a well layer are formed as a light-emitting layer. The Al composition ratio of the first n-type AlGaN layer is higher than that of the barrier layer.

The present specification provides a Group III nitride semiconductor light-emitting device in which electrons and holes are suppressed from being captured by threading dislocation, and a production method therefor.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

With reference to the drawings, specific embodiments of the semiconductor light-emitting device and the production method therefor as an example will next be described in detail. However, these embodiments should not be construed as limiting the invention thereto. The below-described deposition structure of the layers of the semiconductor light-emitting device and the electrode structure are given only for the illustration purpose, and other deposition structures differing therefrom may also be employed. The thickness of each of the layers shown in the drawings is not an actual value, but a conceptual value. The below-described pit sizes are shown larger than the actual ones in the drawings.

First Embodiment

1. Semiconductor Light-Emitting Device

Figure 1:
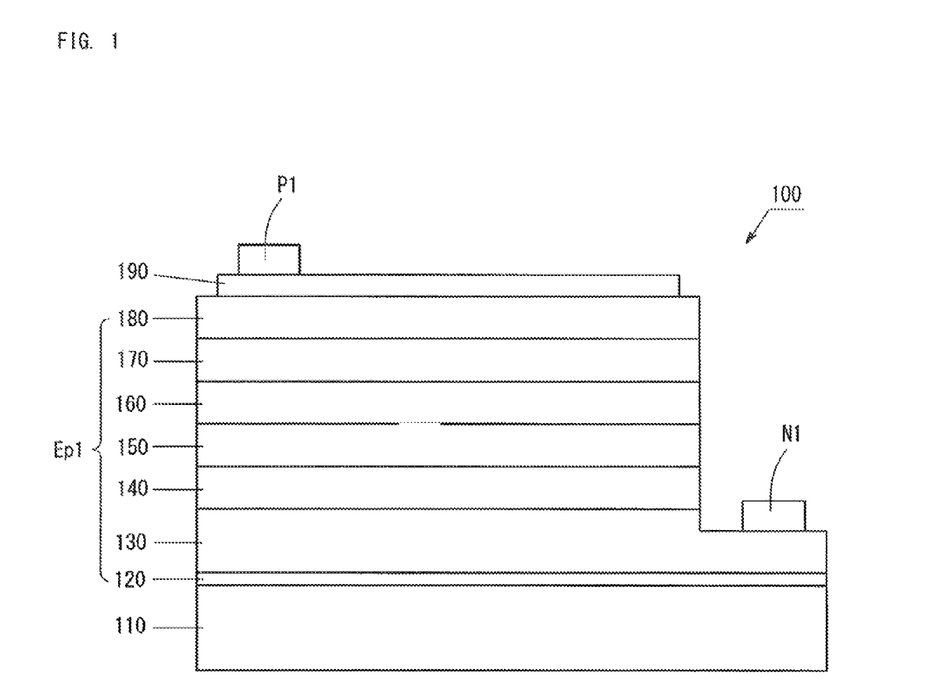
FIG. 1 is a sketch showing the structure of a light-emitting device according to an embodiment.
Figure 2:
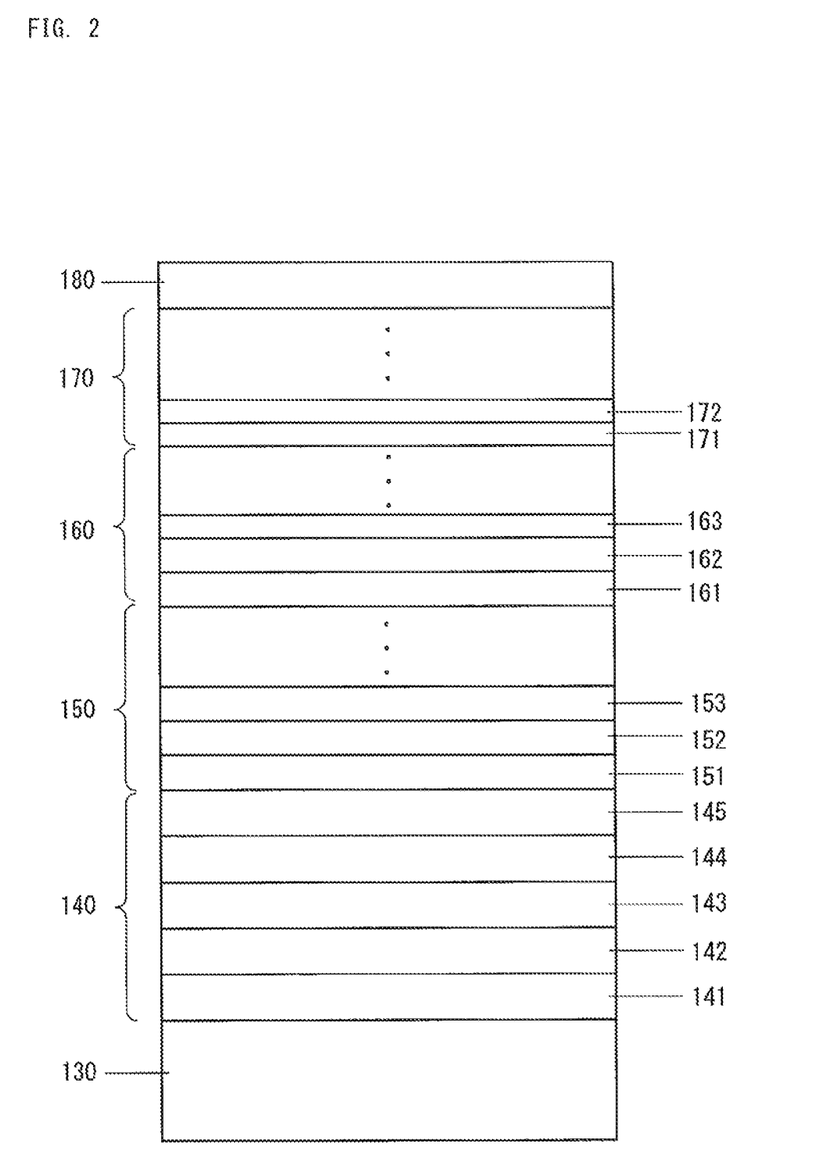
FIG. 2 is a sketch showing the layered structure of semiconductor layers in a light-emitting device according to a first embodiment.

FIG. 1 is a sketch showing the structure of a light-emitting device 100 according to an embodiment. FIG. 2 is a sketch showing the layered structure of semiconductor layers in the light-emitting device 100. The light-emitting device 100 is a face-up type semiconductor light-emitting device. The light-emitting device 100 has a plurality of Group III nitride semiconductor layers.

As shown in FIG. 1, the light-emitting device 100 comprises a substrate 110, a low-temperature buffer layer 120, an n-type contact layer 130, an n-side electrostatic breakdown preventing layer 140, an n-side superlattice layer 150, a light-emitting layer 160, a p-type cladding layer 170, a p-type contact layer 180, a transparent electrode 190, an n-electrode N1, and a p-electrode P1. The low-temperature buffer layer 120, the n-type contact layer 130, the n-side electrostatic breakdown preventing layer 140, the n-side superlattice layer 150, the light-emitting layer 160, the p-type cladding layer 170, and the p-type contact layer 180 are a semiconductor layer Ep1. The n-type contact layer 130, the n-side electrostatic breakdown preventing layer 140, and the n-side superlattice layer 150 are an n-type semiconductor layer. The p-type cladding layer 170 and the p-type contact layer 180 are a p-type semiconductor layer. Moreover, the n-type semiconductor layer may include an ud-GaN layer which is not doped with a donor. The p-type semiconductor layer may include an ud-GaN layer which is not doped with an acceptor.

On a main surface of the substrate 110, a semiconductor layer Ep1 is formed in order of a low-temperature buffer layer 120, an n-type contact layer 130, an n-side electrostatic breakdown preventing layer 140, an n-side superlattice layer 150, a light-emitting layer 160, a p-type cladding layer 170, and a p-type contact layer 180. The n-electrode N1 is formed on the n-type contact layer 130. The p-electrode P1 is formed on the transparent electrode 190.

The substrate 110 is a growth substrate for forming the above semiconductor layers through MOCVD on the main surface thereof. The surface may be roughened. The substrate 110 is made of sapphire. Other than sapphire, materials such as SiC, ZnO, Si, and GaN may be used.

The low-temperature buffer layer 120 is provided so as to form thereon an upper layer while maintaining the crystallinity of substrate 110. Thus, the low-temperature buffer layer 120 is formed on the main surface of the substrate 110. The low-temperature buffer layer 120 is made of, for example, AlN or GaN.

The n-type contact layer 130 is provided so as to establish ohmic contact with the n-electrode N1. The n-type contact layer 130 is formed on the low-temperature buffer layer 120. On the n-type contact layer 130, the n-electrode N1 is disposed. The n-type contact layer 130 is formed of n-type GaN having a Si concentration of $1\times10^{18}/cm^3$ or more. Alternatively, the n-type contact layer 130 may be formed of a plurality of layers having different carrier concentrations for enhancing ohmic contact with the n-electrode N1. The thickness of the n-type contact layer 130 is, for example, 1,000 nm to 10,000 nm. Needless to say, other thickness values may be used.

The n-side electrostatic breakdown preventing layer 140 serves as an electrostatic breakdown-preventing layer for preventing electrostatic breakdown of the semiconductor layers. The n-side electrostatic breakdown preventing layer 140 is formed on the n-type contact layer 130. As shown in FIG. 2, the n-side electrostatic breakdown preventing layer 140 comprises an n-type GaN layer 141, an n-type AlGaN layer 142, an ud-AlGaN layer 143, an ud-GaN layer 144, and an n-type GaN layer 145. The n-type AlGaN layer 142 is a first n-type AlGaN layer. The Al composition ratio of the n-type AlGaN layer 142 is in a range of, for example, 0.04 to 0.30, preferably, 0.04 to 0.20, and more preferably, 0.07 to 0.20. The ud-AlGaN layer 143 is an ud-AlGaN layer (ud-AlGaN: unintentionally doped AlGaN). The ud-AlGaN layer 143 has a donor concentration of $5\times10^{17}/cm^3$ or less. The ud-GaN layer 144 is the same as the ud-AlGaN layer 143.

The n-type GaN layer 141 is formed on the n-type contact layer 130. The n-type AlGaN layer 142 is formed on the n-type GaN layer 141. The ud-AlGaN layer 143 is formed on the n-type AlGaN layer 142. The ud-GaN layer 144 is formed on the ud-AlGaN layer 143. The n-type GaN layer 145 is formed on the ud-GaN layer 144. That is, the n-type GaN layer 141, the n-type AlGaN layer 142, the ud-AlGaN layer 143, the ud-GaN layer 144, and the n-type GaN layer 145 are formed in order on the side far from the light-emitting layer 160.

The thickness of the n-type GaN layer 141 is 300 nm to 1,000 nm. The thickness of the n-type AlGaN layer 142 is 1 nm to 130 nm. The thickness of the ud-AlGaN layer 143 is 50 nm to 500 nm. The thickness of the ud-GaN layer 144 is 10 nm to 300 nm. The thickness of the n-type GaN layer 145 is 10 nm to 100 nm. These thicknesses are merely examples. Therefore, other values may be used.

The n-side superlattice layer 150 is a strain relaxation layer for relaxing the stress applied to the light-emitting layer 160. More specifically, the n-side superlattice layer 150 has a superlattice structure. The n-side superlattice layer 150 is formed on the n-side electrostatic breakdown preventing layer 140. As shown in FIG. 2, the n-side superlattice layer 150 is formed by repeatedly depositing layer units, each layer unit comprising an InGaN layer 151, a GaN layer 152, and an n-type GaN layer 153 deposited. The number of repetitions is 10 to 20. The number of repetitions may be any other number.

The thickness of the InGaN layer 151 is, for example, 0.3 nm to 100 nm. The thickness of the GaN layer 152 is 0.3 nm to 10 nm. The thickness of the n-type GaN layer 153 is 0.3 nm to 100 nm. These thickness values are merely examples. Therefore, other values may be used.

The light-emitting layer 160 emits light through recombination of electrons and holes. The light-emitting layer 160 is formed on the n-side superlattice layer 150. As shown in FIG. 2, the light-emitting layer 160 is formed by repeatedly depositing layer units, each layer unit comprising a well layer 161, a capping layer 162, and a barrier layer 163 deposited. That is, the light-emitting layer 160 has a Multi Quantum Well structure (MQW structure). The capping layer 162 serves as a protective layer which protects the well layer 161 from heat. For example, the protective layer prevents sublimation of In in the well layer 161.

The number of repetitions is, for example, 5 to 20. However, needless to say, the number of repetitions may be any other number. The well layer 161 is, for example, an InGaN layer. The capping layer 162 is, for example, a GaN layer. The barrier layer 163 is, for example, an AlGaN layer. The Al composition ratio of the barrier layer 163 is preferably in a range of 0.03 (3%) to 0.08 (8%), for example, approximately 0.07 (7%). In this case, the light-emitting device 100 has a high light output. These materials are merely examples. Therefore, these materials of the semiconductor layers may be semiconductor having other composition ratio. For example, the barrier layer 163 may be a GaN layer.

The thickness of the well layer 161 is, for example, 1 nm to 5 nm. The thickness of the capping layer 162 is, for example, 0.2 nm to 1.8 nm. The thickness of the barrier layer 163 is, for example, 1 nm to 10 nm. These thickness values are given as examples, and values falling outside the ranges may be employed. The total thickness of the light-emitting layer 160 is 500 nm to 1,000 nm. Needless to say, any other total thickness may be used.

The p-type cladding layer 170 is formed on the light-emitting layer 160. As shown in FIG. 2, the p-type cladding layer 170 is formed by repeatedly depositing a p-type InGaN layer 171 and a p-type AlGaN layer 172. The number of repetitions is, for example, 5 to 20. Needless to say, the number of repetitions may be any other number. The In composition ratio of the p-type InGaN layer 171 is 0.05 to 0.30. The thickness of the p-type InGaN layer 171 is 0.2 nm to 5 nm. The Al composition ratio of the p-type AlGaN layer 172 is 0.10 to 0.4. The thickness of the p-type AlGaN layer 172 is 1 nm to 5 nm. These values are merely examples, and other values may be used. Also, the structure of the p-type cladding layer 170 may differ from the structure described above.

The p-type contact layer 180 is formed on the p-type cladding layer 170. The thickness of the p-type contact layer 180 is 10 nm to 100 nm. The p-type contact layer 180 is doped with Mg at a concentration of $1\times10^{19}/cm^3$ to $1\times10^{22}/cm^3$.

The transparent electrode 190 is formed on the p-type contact layer 180. The material of the transparent electrode 190 is preferably any one of ITO, IZO, ICO, ZnO, $TiO_2$, $NbTiO_2$, $TaTiO_2$, and $SnO_2$.

The p-electrode P1 is formed on the transparent electrode 190. The p-electrode P1 is formed of a Ni layer and an Au layer, sequentially deposited on the transparent electrode 190. Needless to say, any other structure may be used.

The n-electrode N1 is formed on the n-type contact layer 130. The n-electrode N1 is formed of a V layer and an Al layer, sequentially deposited on the n-type contact layer 130. Alternatively, a Ti layer and an Al layer may be sequentially deposited in the same manner. Needless to say, any other structure may be used.

The light-emitting device 100 may include a protective film for protecting the semiconductor layer Ep1.

2. Pit

2-1. Pit Structure

Figure 3:
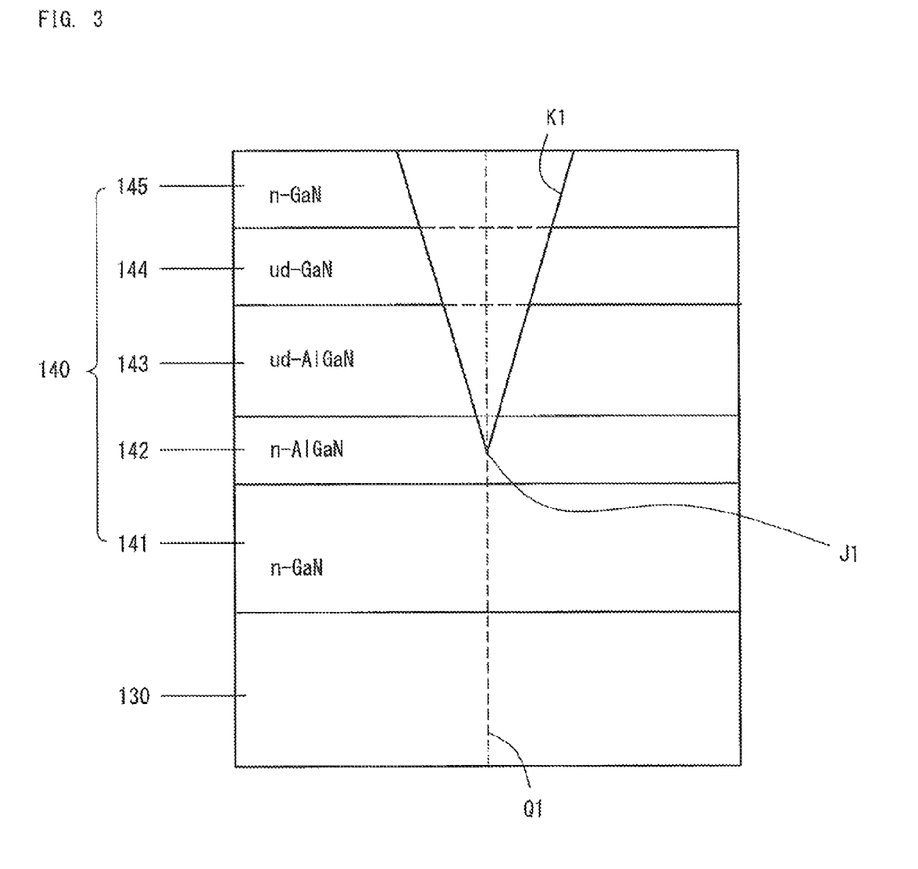
FIG. 3 is a sketch for describing a pit formed in the light-emitting device according to the first embodiment.

FIG. 3 is a sketch showing a pit K1 of the light-emitting device 100. The light-emitting device 100 has a plurality of pits K1 extending from the n-type semiconductor layer to the p-type semiconductor layer. FIG. 3 illustrates only an extracted part of the n-type semiconductor layer. The pit K1 is formed at threading dislocation Q1 in growing the semiconductor layer Ep1 of the light-emitting device 100. The pit K1 is grown from the n-type AlGaN layer 142 of the n-side electrostatic breakdown preventing layer 140. That is, the threading dislocation growing upward on the substrate 110, extends laterally, i.e., in a direction perpendicular to the growth direction of the threading dislocation in the n-side electrostatic breakdown preventing layer 140, resulting in the pit K1. The pit K1 is grown until it reaches the p-type contact layer 180.

The pit K1 starts to grow from the starting point J1 in the threading dislocation Q1. The semiconductor layer actually has a plurality of pits K1. The starting points J1 of these pits K1 are positioned in the n-type AlGaN layer 142. That is, the n-type AlGaN layer 142 includes the starting points J1 of the pits K1. The starting points J1 of these pits K1 are positioned at almost the same depths in the n-type AlGaN layer 142.

The diameter of the pit K1 varies with the thickness of the n-side electrostatic breakdown preventing layer 140 and the growth temperature of the n-side electrostatic breakdown preventing layer 140. As the thickness of the n-side electrostatic breakdown preventing layer 140 is increased, the pit diameter at the upper surface of the layer 140 is increased. On the contrary, as the thickness of the n-side electrostatic breakdown preventing layer 140 is decreased, the pit diameter is decreased. As the growth temperature of the n-side electrostatic breakdown preventing layer 140 is increased, the pit diameter is decreased. On the contrary, as the growth temperature of the n-side electrostatic breakdown preventing layer 140 is decreased, the pit diameter is increased.

The pit diameter at an interface between the light-emitting layer 160 and the p-type cladding layer 170 is 160 nm to 200 nm. The pit diameter at an interface between the n-side electrostatic breakdown preventing layer 140 and the n-side superlattice layer 150 is 140 nm to 180 nm. The average pit density of the pits K1 at an interface between the light-emitting layer 160 and the p-type cladding layer 170 is $1.0 \times 10^8$ cm$^{-2}$ to $4.0 \times 10^8$ cm$^{-2}$. The ratio of the areas occupied by the pits K1 to the area of an interface between the light-emitting layer 160 and the p-type cladding layer 170 is 3% to 7%. The ratio of the areas occupied by the pits K1 to the area of an interface between the n-side electrostatic breakdown preventing layer 140 and the n-side superlattice layer 150 is 2% to 6%. These are merely examples. Therefore, the above indices may be other values.

2-2. Effect when Pits are Grown from AlGaN Layer

As mentioned above, the starting points J1 of the pits K1 are positioned in the n-type AlGaN layer 142. The n-type AlGaN layer 142 is a semiconductor layer having a higher resistivity than that of GaN layer. Therefore, carriers are difficult to enter the pits K1. That is, carriers are hardly captured by threading dislocation Q1 being a defect. Thereby, non-radiative recombination can be suppressed in the threading dislocation Q1.

Generally, resistivity of the n-type AlGaN layer is higher than that of GaN layer. Therefore, it is preferable to avoid using an AlGaN layer as a semiconductor layer of the semiconductor light-emitting device. However, in the present embodiment, an n-type AlGaN layer 142 is formed on the n-side electrostatic breakdown preventing layer 140 to suppress non-radiative recombination of carriers in the threading dislocation Q1. The n-type AlGaN layer 142 is preferably not so thick. When the n-type AlGaN layer 142 having a high resistivity is thick, current hardly flows in a flat region other than the pits K1. Therefore, the thickness of the n-type AlGaN layer 142 is preferably, for example, 1 nm to 130 nm. Details will be later described in Experiment section.

3. Method for Producing a Semiconductor Light-Emitting Device

A description will next be given of a method for producing the light-emitting device 100 according to the first embodiment. Crystals forming the semiconductor layers are epitaxially grown through Metal Organic Chemical Vapor Deposition (MOCVD). The carrier gas used is hydrogen ($H_2$), nitrogen ($N_2$), or a gas mixture of hydrogen and nitrogen ($H_2+N_2$). Ammonia gas ($NH_3$) is used as a nitrogen source. Trimethylgallium ($Ga(CH_3)_3$) is used as a Ga source. Trimethylindium ($In(CH_3)_3$) is used as an In source. Trimethylaluminum ($Al(CH_3)_3$) is used as an Al source. Silane ($SiH_4$) is used as an n-type dopant gas. Bis(cyclopentadienyl)magnesium ($Mg(C_5H_5)_2$) is used as the p-type dopant gas. Any gas other than the above may be used.

3-1. N-Type Contact Layer Formation Step

Firstly, a low-temperature buffer layer 120 is formed on a main surface of a substrate 110. An n-type contact layer 130 is formed on a buffer layer 120. The temperature of the substrate in this process is 1,080° C. to 1,140° C.

3-2. N-Side Electrostatic Breakdown Preventing Layer Formation Step

Figure 4:
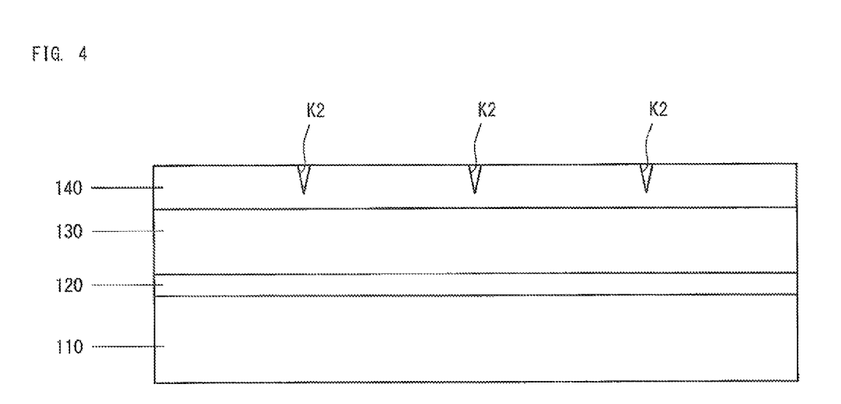
FIG. 4 is a sketch (No. 1) for describing a method for producing a light-emitting device according to the first embodiment.

Next, an n-side electrostatic breakdown preventing layer 140 is formed on the n-type contact layer 130. Firstly, an n-type GaN layer 141 is formed by the supply of silane ($SiH_4$). The Si concentration of the n-type GaN layer 141 is $2.5 \times 10^{17}$/cm$^3$. Then, an n-type AlGaN layer 142 is formed by the supply of silane ($SiH_4$). The Si concentration of the n-type AlGaN layer 142 is $2 \times 10^{18}$/cm$^3$ to $1.3 \times 10^{19}$/cm$^3$. The Si concentration of the n-type AlGaN layer 142 is preferably higher than that of the n-type GaN layer 141. The supply of silane ($SiH_4$) is stopped, and an ud-AlGaN layer 143 is formed. The supply of silane ($SiH_4$) is stopped, and an ud-GaN layer 144 is formed. Alternatively, the AlGaN layer 143 and the GaN layer 144 may be doped with In. Then, an n-type GaN layer 145 is formed by supplying silane ($SiH_4$) again. The temperature of the substrate in this process is any temperature within a range of 750° C. to 950° C. Particularly, the n-type AlGaN layer 142 is formed at a temperature lower by 190° C. to 330° C. than the temperature at which the n-type GaN layer 141 is formed. Consequently, the pit occurrence position can be controlled. In this process, as shown in FIG. 4, pits K2 are formed with the n-type AlGaN layer 142 as a starting point. To this end, the temperature of the substrate is decreased when the n-type AlGaN layer 142 is formed. Thus, the temperature of the substrate when the n-type AlGaN layer 142 is formed, is lower than that when the n-type GaN layer 141 is formed. The position of the starting point J1 is controlled by a growth condition, e.g., growth temperature, pressure or growth rate. Especially the position of the starting point J1 is controlled by decreasing the growth temperature of the n-type AlGaN layer 142 from the growth temperature of the n-type GaN layer 141. The pits K2 are grown with the subsequent growth of the semiconductor layer, resulting in pits K1. In this way, while forming the pits K2, the n-side electrostatic breakdown preventing layer 140 is formed.

3-3. N-Side Superlattice Layer Formation Step

Next, an n-side superlattice layer 150 is formed. Firstly, an InGaN layer 151 is formed on the n-type GaN layer 145 of the n-side electrostatic breakdown preventing layer 140. Then, a GaN layer 152 is formed on the InGaN layer 151. An n-type GaN layer 153 is formed on the GaN layer 152. In this way, layer units, each comprising the InGaN layer 151, the GaN layer 152, and the n-type GaN layer 153, are repeatedly deposited.

3-4. Light-Emitting Layer Formation Step

Next, a light-emitting layer 160 is formed on the n-side superlattice layer 150. To this end, layer units, each comprising the well layer 161, the capping layer 162, and the barrier layer 163 deposited in this order, are repeatedly deposited. That is, the light-emitting layer formation step comprises a well layer formation step of forming a well layer 161, a capping layer formation step of forming a capping layer 162 on the well layer 161, and a barrier layer formation step of forming a barrier layer 163 on the capping layer 162. These steps are repeatedly performed. Therefore, the well layer 161 is formed on the barrier layer 163 again. The temperature of the substrate in growing the well layer 161 is set to 730° C. to 850° C.

3-5. P-Type Cladding Layer Formation Step

Next, a p-type cladding layer 170 is formed on the light-emitting layer 160. Here, a p-type InGaN layer 171 and a p-type AlGaN layer 172 are repeatedly deposited.

3-6. P-Type Contact Layer Formation Step

Figure 5:
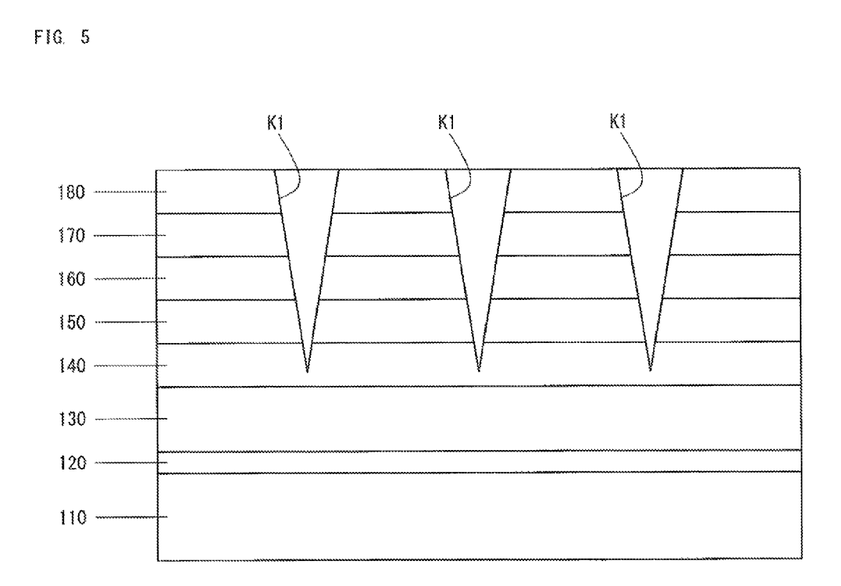
FIG. 5 is a sketch (No. 2) for describing a method for producing a light-emitting device according to the first embodiment.

Next, a p-type contact layer 180 is formed on the p-type cladding layer 170. The temperature of the substrate in this process is set to 900° C. to 1,050° C. Thus, as shown in FIG. 5, the semiconductor layers are deposited on the substrate 110. The pits K1 are formed so as to extend from the n-side electrostatic breakdown preventing layer 140 to the p-type contact layer 180.

3-7. Transparent Electrode Formation Step

Next, a transparent electrode 190 is formed on the p-type contact layer 180.

3-8. Electrode Formation Step

Next, a p-electrode P1 is formed on the transparent electrode 190. Then, a part of the semiconductor layers are removed from the p-type contact layer 180 by a laser or by etching to expose the n-type contact layer 130. Then an n-electrode N1 is formed on the exposed portion of the n-type contact layer 130. The step of forming a p-electrode P1 may be performed before the step of forming an n-electrode N1, or the step of forming an n-electrode N1 may be performed before the step of forming a p-electrode P1.

3-9. Other Steps

In addition to the steps described above, other steps such as a heat treatment step and an insulating film formation step may be performed. Through the steps described above, the light-emitting device 100 shown in FIG. 1 is produced.

Figure 6:
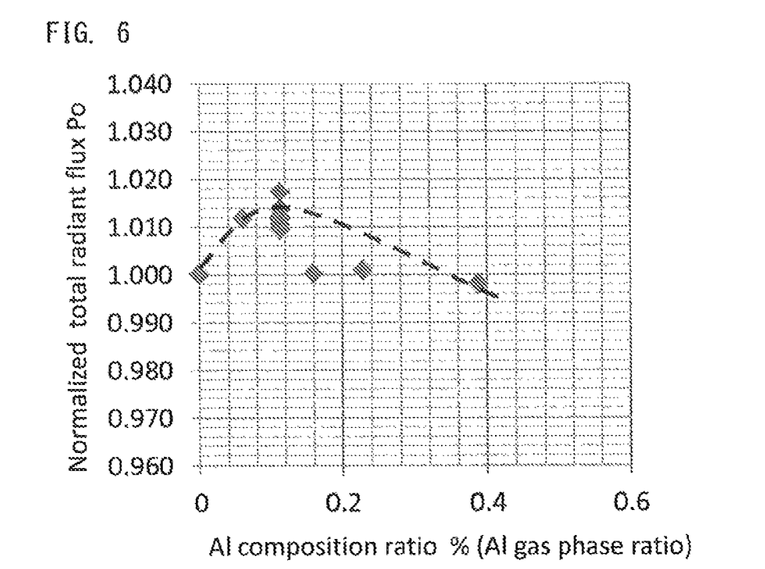
FIG. 6 is a graph showing the relationship between the Al composition ratio of the first n-type AlGaN layer and the total radiant flux.

4. Experiments 4-1. Al Composition Ratio of N-Type AlGaN Layer and Total Radiant Flux FIG. 6 is a graph showing the relationship between the Al composition ratio of the n-type AlGaN layer 142 and the total radiant flux. The horizontal axis of FIG. 6 indicates the Al composition ratio of the n-type AlGaN layer 142. The vertical axis of FIG. 6 indicates the total radiant flux Po of the light-emitting device. The total radiant flux Po is normalized as 1 when the Al composition ratio is zero. As shown in FIG. 6, as the Al composition ratio of the n-type AlGaN layer 142 is increased, the total radiant flux is gradually increased. When the Al composition ratio exceeds a certain value, the total radiant flux is gradually decreased.

As shown in FIG. 6, the Al composition ratio of the n-type AlGaN layer 142 is, preferably, 0.01 (1%) to 0.3 (30%). When the Al composition ratio of the n-type AlGaN layer 142 is 0.01 to 0.3, the total radiant flux value of the light-emitting device is larger than the total radiant flux value of the light-emitting device when the Al composition ratio of the n-type AlGaN layer 142 is 0 (0%). The Al composition ratio of the n-type AlGaN layer 142 is preferably 0.02 (2%) to 0.27 (27%), more preferably 0.07(%) to 0.2 (20%). The Al composition ratio of the n-type AlGaN layer 142 is, most preferably, 0.04 (4%) to 0.2 (20%).

Here, the barrier layer 163 of the light-emitting layer 160 is an AlGaN layer having an Al composition ratio of 7%. As described in Variation section below, the Al composition ratio of the n-type AlGaN layer 142 is preferably higher than that of the barrier layer 163. This can prevent the leakage of carriers from the light-emitting layer 160. The Al composition ratio of the n-type AlGaN layer 142 is, further preferably, 0.07 (7%) to 0.2 (20%).

4-2. Al Composition Ratio of N-Type AlGaN Layer and Driving Voltage

Figure 7:
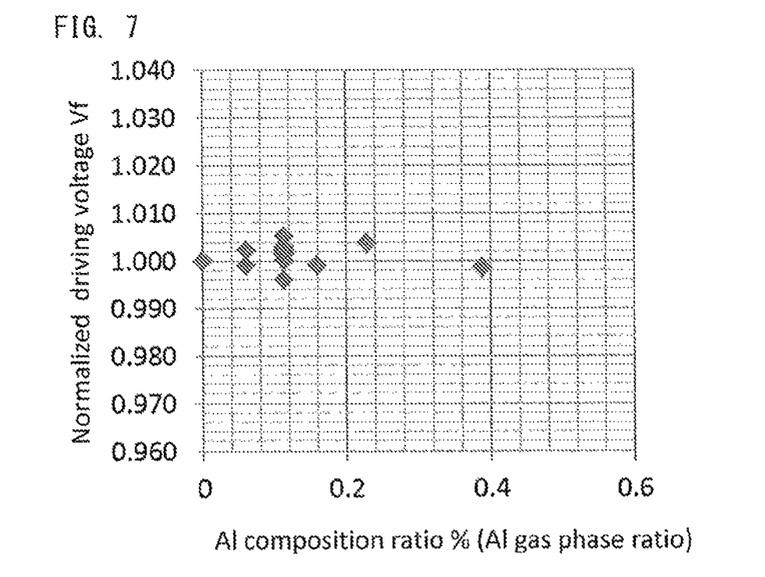
FIG. 7 is a graph showing the relationship between the Al composition ratio of the first n-type AlGaN layer and the driving voltage.

FIG. 7 is a graph showing the relationship between the Al composition ratio of the n-type AlGaN layer 142 and the driving voltage. The horizontal axis of FIG. 7 indicates the Al composition ratio of the n-type AlGaN layer 142. The vertical axis of the FIG. 7 indicates the driving voltage Vf of the light-emitting device. The driving voltage Vf is normalized as 1 when the Al composition ratio is zero. As shown in FIG. 7, the driving voltage Vf hardly depends on the Al composition ratio of the n-type AlGaN layer 142.

4-3. Thickness of N-Type AlGaN Layer and Total Radiant Flux

Figure 8:
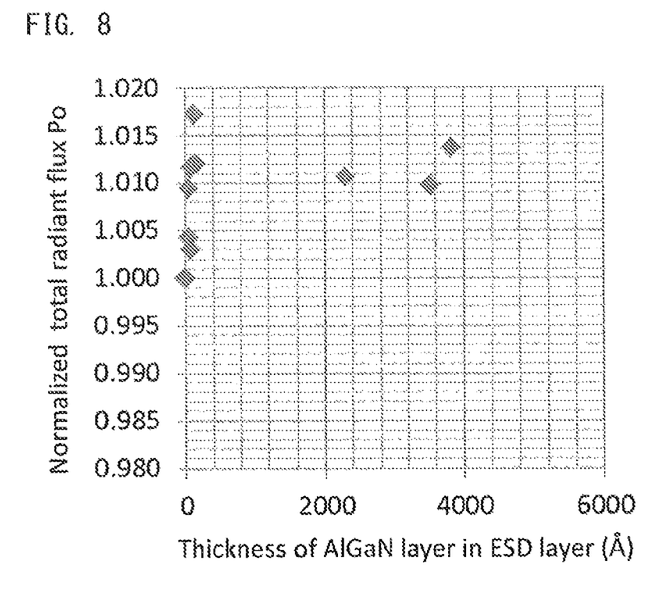
FIG. 8 is a graph showing the relationship between the thickness of the first n-type AlGaN layer and the total radiant flux.

FIG. 8 is a graph showing the relationship between the thickness of the n-type AlGaN layer 142 and the total radiant flux. The horizontal axis of FIG. 8 indicates the thickness (Å) of the n-type AlGaN layer 142. The vertical axis of FIG. 8 indicates the total radiant flux Po of the light-emitting device. The value of the total radiant flux Po is normalized as 1 when the thickness of the n-type AlGaN layer 142 is zero. At this time, the n-type AlGaN layer does not exist, and alternatively, the n-type GaN layer having the same thickness as that of the n-type AlGaN layer 142 exists. As shown in FIG. 8, as the thickness of the n-type AlGaN layer 142 is increased, the total radiant flux Po of the light-emitting device is increased. The total radiant flux Po is saturated at approximately 1.01.

Figure 9:
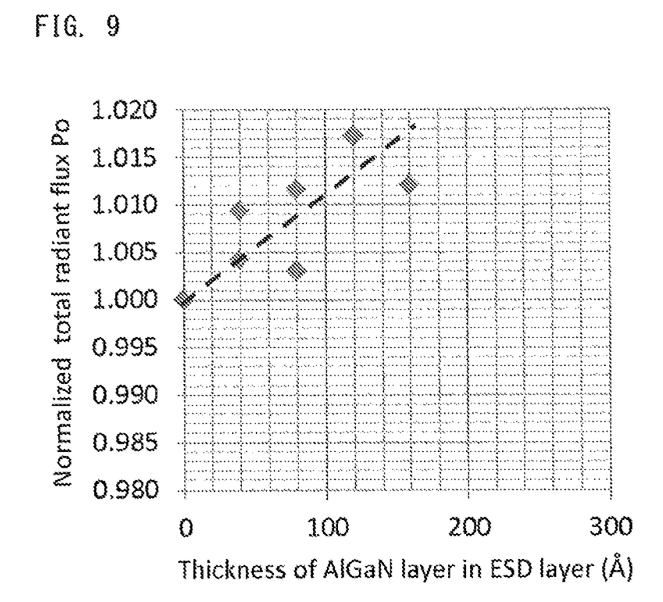
FIG. 9 is an enlarged view of FIG. 8.

FIG. 9 is an enlarged view within a thickness range of 0 Å to 200 Å in FIG. 8. As shown in FIG. 9, when the thickness is within a range of a several hundred of Å, the total radiant flux of the light-emitting device is increased as the thickness is increased.

4-4. Thickness of N-Type AlGaN Layer and Driving Voltage

Figure 10:
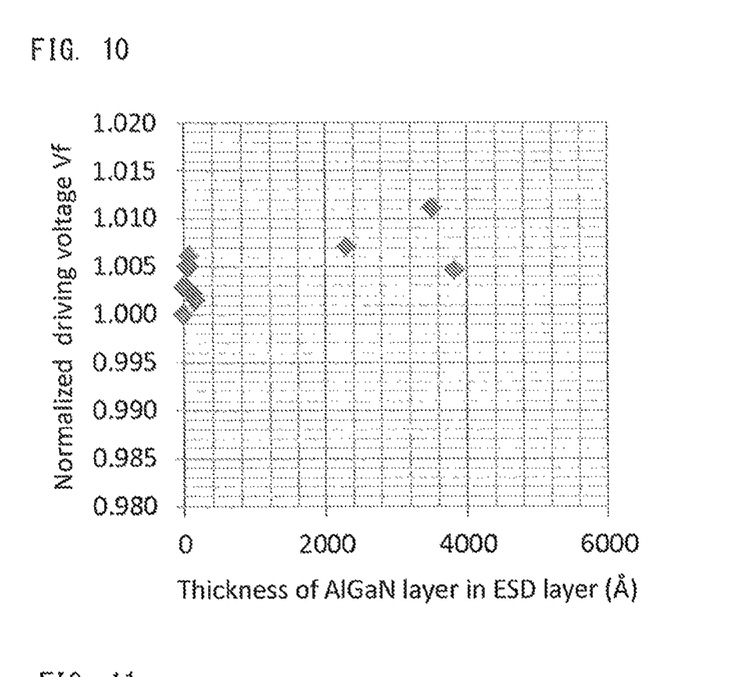
FIG. 10 is a graph showing the relationship between the thickness of the first n-type AlGaN layer and the driving voltage.

FIG. 10 is a graph showing the relationship between the thickness of the n-type AlGaN layer 142 and the driving voltage. The horizontal axis of FIG. 10 indicates the thickness (Å) of the n-type AlGaN layer 142. The vertical axis of FIG. 10 indicates the driving voltage Vf of the light-emitting device. The driving voltage Vf is normalized as 1 when the thickness of the n-type AlGaN layer 142 is zero. As shown in FIG. 10, the driving voltage Vf hardly depends on the thickness of the n-type AlGaN layer 142.

Figure 11:
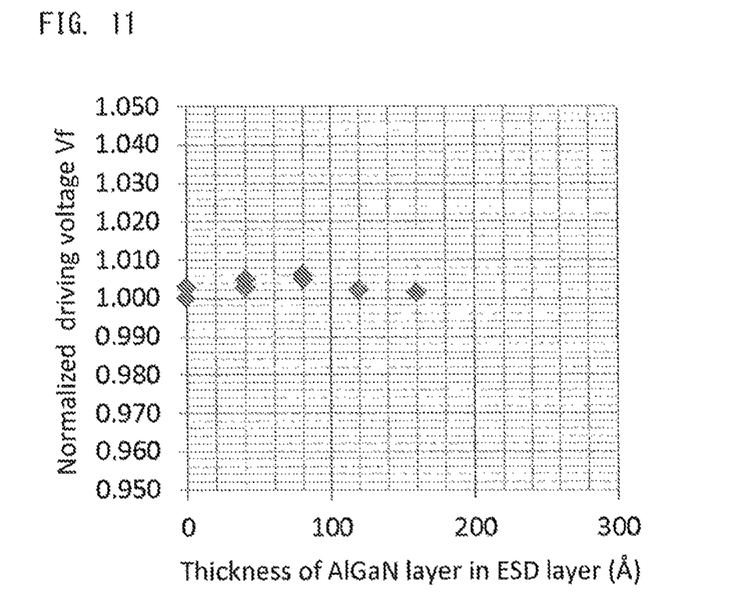
FIG. 11 is an enlarged view of FIG. 10.

FIG. 11 is an enlarged view within a thickness range of 0 Å to 200 Å in FIG. 10. As shown in FIG. 11, when the thickness is within a range of a several hundred Å, the driving voltage Vf of the light-emitting device is almost constant.

Figure 12:
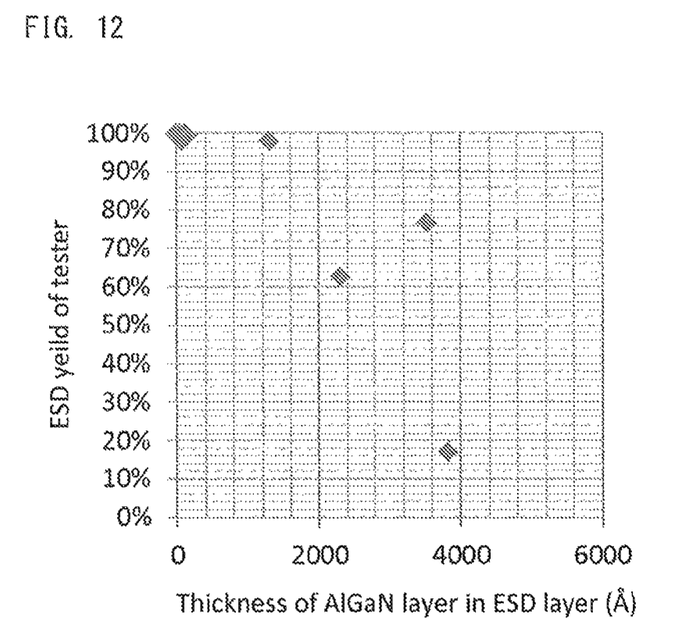
FIG. 12 is a graph showing the relationship between the thickness of the first n-type AlGaN layer and the yield rate in the electrostatic discharge test.

4-5. Thickness of N-Type AlGaN Layer and Yield Rate in the Electrostatic Discharge Test FIG. 12 is a graph showing the relationship between the thickness of the n-type AlGaN layer 142 and the yield rate in the electrostatic discharge test. The horizontal axis of FIG. 12 indicates the thickness (Å) of the n-type AlGaN layer 142. The vertical axis of FIG. 12 indicates the yield rate in the electrostatic discharge test. As shown in FIG. 12, the thickness of the n-type AlGaN layer 142 is larger than 1300 Å, the yield rate of the light-emitting device is reduced. Therefore, the thickness of the n-type AlGaN layer 142 is preferably not more than 130 nm. That is, the thickness of the n-type AlGaN layer 142 is preferably 1 nm to 130 nm.

4-6. Effect of N-Type AlGaN Layer

In the present embodiment, the starting points J1 of the pits K1 are positioned in the n-type AlGaN layer 142. The resistivity of the n-type AlGaN layer 142 is higher than that of the n-type GaN layer. That is, the n-type AlGaN layer 142 has a carrier blocking function. Therefore, carriers hardly exist around the starting points J1 of the pits K1 in the n-type AlGaN layer 142. Thus, non-radiative recombination of carriers hardly occurs in the threading dislocation Q1. As a result, the total radiant flux Po of the light-emitting device is improved.

In view of FIG. 6, when the Al composition ratio of the n-type AlGaN layer 142 is too small, carrier leakage in the threading dislocation Q1 is difficult to be sufficiently suppressed. When the Al composition ratio of the n-type AlGaN layer 142 is too high, the resistivity of the n-type AlGaN layer 142 is high. Therefore, current hardly flows in a region other than the pits K1.

In view of FIGS. 8 and 9, when the thickness of the n-type AlGaN layer 142 is too small, carrier leakage in the threading dislocation Q1 is difficult to be sufficiently suppressed. When the thickness of the n-type AlGaN layer 142 is too large, the resistance of the n-type AlGaN layer 142 is high. Therefore, current hardly flows in a region other than the pits K1.

5. Variation 5-1. Al Composition Ratio of n-Type AlGaN Layer

In the present embodiment, the barrier layer 163 of the light-emitting layer 160 is an AlGaN layer. In this way, the barrier layer 163 contains Al. The Al composition ratio of the n-type AlGaN layer 142 is preferably larger than that of the barrier layer 163. This prevents leakage of carriers confined in the light-emitting layer 160 from the light-emitting layer 160. That is, in this case, the n-type AlGaN layer 142 suppresses carrier leakage from the light-emitting layer 160. The emission efficiency of the light-emitting device is higher than that of the conventional light-emitting device.

5-2. Filling in Pit

In the present embodiment, the pits K1 extend from the n-side electrostatic breakdown preventing layer 140 to the p-type contact layer 180. However, the pits K1 may be filled when they reached the p-type cladding layer 170. It is the same that the pits K1 are formed extending from the n-type semiconductor layer to the p-type semiconductor layer. Thus, the pits K1 may be filled at the middle of the p-type semiconductor layer.

5-3. Light-Emitting Layer

In the present embodiment, the light-emitting layer 160 is formed by repeatedly depositing layer units, each comprising the well layer 161, the capping layer 162, and the barrier layer 163 sequentially deposited. However, the capping layer 162 may be omitted. In that case, the well layer 161 and the barrier layer 163 may be repeatedly deposited as layer units.

5-4. Flip-Chip Type Light-Emitting Device

In the present embodiment, the light-emitting device 100 is of a face-up type. However, the technique of the present embodiment is applicable to a flip-chip type light-emitting device.

5-5. N-Side Electrostatic Breakdown Preventing Layer

In the present embodiment, the n-side electrostatic breakdown preventing layer 140 has a five-layer structure. However, other structure may be employed. The n-side electrostatic breakdown preventing layer 140 may only include an n-type AlGaN layer 142 including the starting points J1 of the pits K1.

6. Summary of the Present Embodiment

As described above in detail, in the light-emitting device 100 of the present embodiment, the n-side electrostatic breakdown preventing layer 140 has an n-type AlGaN layer 142. The n-type AlGaN layer 142 includes the starting points J1 of the pits K1 therein. Therefore, carriers are difficult to leak from the threading dislocation Q1. This achieves a light-emitting device 100 exhibiting improved total radiant flux.

The above-described embodiment is merely an example. Accordingly, needless to say, the embodiment may be improved or modified in various ways without departing from the scope of the present invention. The deposition structure of the layered body is not necessarily limited to the above-illustrated structure. The deposition structure, the number of repetitions of layers, etc. may be freely selected. The vapor deposition method is not limited to the metal organic chemical vapor deposition (MOCVD). Any other vapor deposition method may be used so long as it uses a carrier gas to grow crystals. The semiconductor layers may be formed through another epitaxial growth method such as liquid-phase epitaxy or molecular beam epitaxy.

Second Embodiment

The second embodiment will be described below. The deposition structure of the n-side electrostatic breakdown preventing layer is different between the second embodiment and the first embodiment. Therefore, only differences will be described.

1. N-Side Electrostatic Breakdown Preventing Layer

Figure 13:
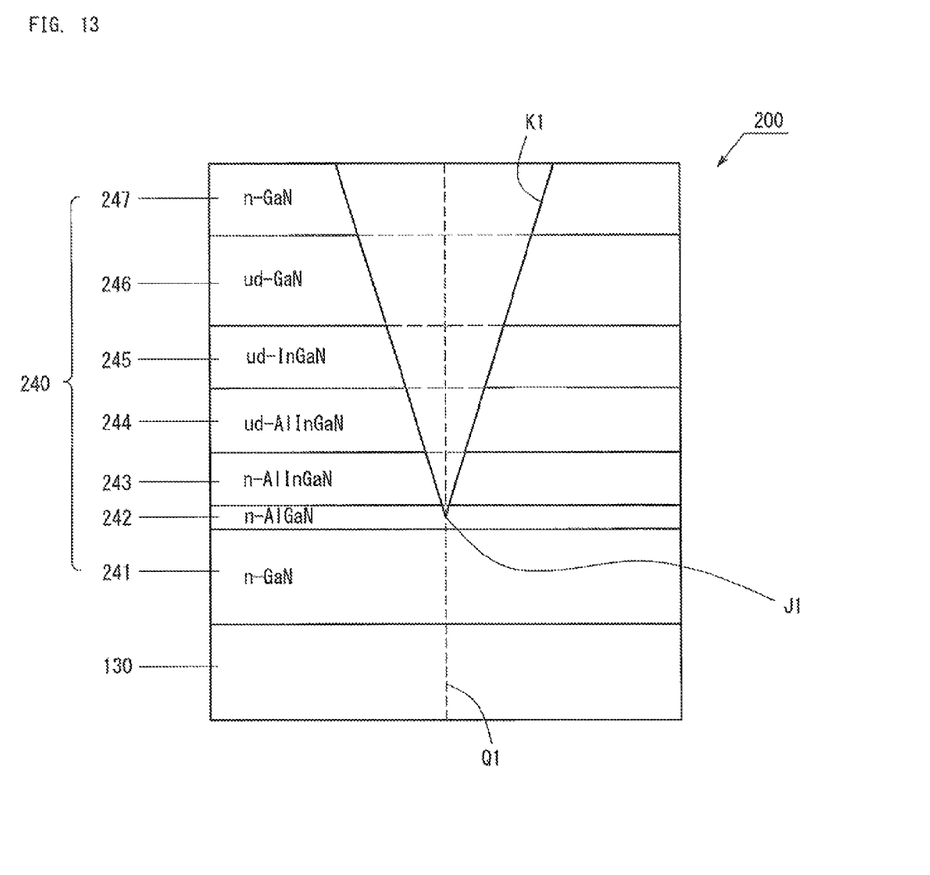
FIG. 13 is a sketch for describing an n-side electrostatic breakdown preventing layer of a light-emitting device according to a second embodiment.

As shown in FIG. 13, the light-emitting device 200 of the second embodiment has an n-side electrostatic breakdown preventing layer 240 on the n-type contact layer 130. The n-side electrostatic breakdown preventing layer 240 comprises an n-type GaN layer 241, an n-type AlGaN layer 242, an n-type AlInGaN layer 243, an ud-AlInGaN layer 244, an ud-InGaN layer 245, an ud-GaN layer 246, and an n-type GaN layer 247. That is, the n-type GaN layer 241, the n-type AlGaN layer 242, the n-type AlInGaN layer 243, the ud-AlInGaN layer 244, the ud-InGaN layer 245, the ud-GaN layer 246, and the n-type GaN layer 247 are formed in order on the side far from the light-emitting layer 160.

The light-emitting device 200 has a plurality of pits K1. The starting points J1 of the pits K1 are positioned in the n-type AlGaN layer 242. That is, the n-type AlGaN layer 242 includes the starting points J1 of the pits K1.

The thickness of the n-type GaN layer 241 is 300 nm to 1,000 nm. The Si concentration of the n-type GaN layer 241 is $2.5 \times 10^{17}/cm^3$. The thickness of the n-type AlGaN layer 242 is 1 nm to 30 nm. The Si concentration of the n-type AlGaN layer 242 is $2 \times 10^{18}/cm^3$ to $1.3 \times 10^{19}/cm^3$. The n-type AlGaN layer 242 is formed at a temperature lower by 190° C. to 330° C. than the temperature at which the n-type GaN layer 241 is formed. The thickness of the n-type AlInGaN layer 243 is 10 nm to 50 nm. The thickness of the ud-AlInGaN layer 244 is 10 nm to 100 nm. The total thickness of the n-type AlGaN layer 242, the n-type AlInGaN layer 243, and the ud-AlInGaN layer 244 is 21 nm to 130 nm. The thickness of the ud-InGaN layer 245 is 10 nm to 100 nm. The thickness of the ud-GaN layer 246 is 10 nm to 300 nm. The thickness of the n-type GaN layer 247 is 10 nm to 100 nm. These thickness values are merely examples. Other values may be used. The In composition ratios of the n-type AlInGaN layer 243, the ud-AlInGaN layer 244, and the ud-InGaN layer 245 are not limited but are preferably higher than 0 and lower than 0.0035, and more preferably, 0.001 to 0.003.

2. Effect of In

A potential barrier is formed by the In-doped of the n-type AlInGaN layer 243. Therefore, the existence probability of electrons and holes is low in the vicinity of threading dislocation. Non-radiative recombination is further suppressed in the threading dislocation. Moreover, the surface flatness of the semiconductor layer is improved by the surfactant effect of In atoms. Thereby, a semiconductor light-emitting device having superior emission efficiency is achieved.

Third Embodiment

The third embodiment will be described below. The deposition structure of the n-side electrostatic breakdown preventing layer is different between the third embodiment and the first embodiment. Therefore, only differences will be described.

1. N-Side Electrostatic Breakdown Preventing Layer

Figure 14:
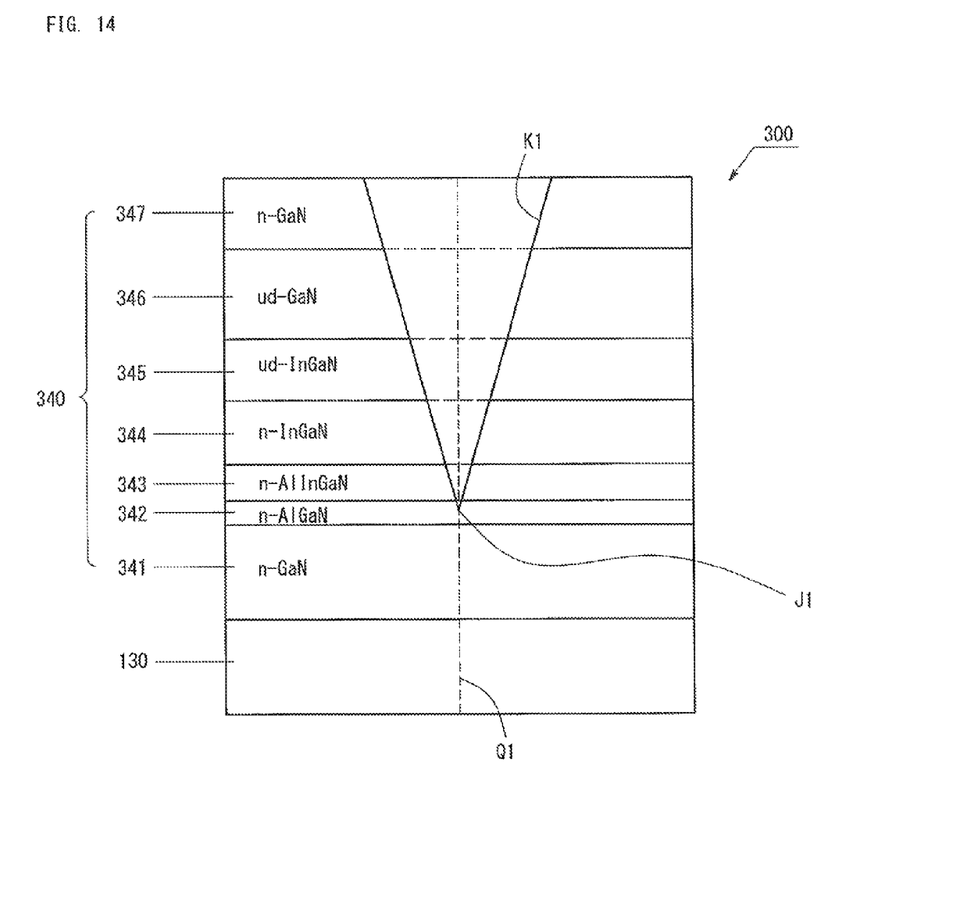
FIG. 14 is a sketch for describing an n-side electrostatic breakdown preventing layer of a light-emitting device according to a third embodiment.

As shown in FIG. 14, the light-emitting device 300 of the third embodiment has an n-side electrostatic breakdown preventing layer 340 on the n-type contact layer 130. The n-side electrostatic breakdown preventing layer 340 comprises an n-type GaN layer 341, an n-type AlGaN layer 342, an n-type AlInGaN layer 343, an n-type InGaN layer 344, an ud-InGaN layer 345, an ud-GaN layer 346, and an n-type GaN layer 347. That is, the n-type GaN layer 341, the n-type AlGaN layer 342, the n-type AlInGaN layer 343, the n-type InGaN layer 344, the ud-InGaN layer 345, the ud-GaN layer 346, and the n-type GaN layer 347 are formed in order on the side far from the light-emitting layer 160.

The light-emitting device 300 has a plurality of pits K1. The starting points J1 of the pits K1 are positioned in the n-type AlGaN layer 342. That is, the n-type AlGaN layer 342 includes the starting points J1 of the pits K1.

The thickness of the n-type GaN layer 341 is 1 nm to 1,000 nm. The Si concentration of the n-type GaN layer 341 is $2.5 \times 10^{17}/cm^3$. The thickness of the n-type AlGaN layer 342 is 1 nm to 30 nm. The Si concentration of the n-type AlGaN layer 342 is $2 \times 10^{18}/cm^3$ to $1.3 \times 10^{19}/cm^3$. The n-type AlGaN layer 342 is formed at a temperature lower by 190° C. to 330° C. than the temperature at which the n-type GaN layer 341 is formed. The thickness of the n-type AlInGaN layer 343 is 5 nm to 110 nm. The total thickness of the n-type AlGaN layer 342 and the n-type AlInGaN layer 343 is 6 nm to 130 nm. The thickness of the n-type InGaN layer 344 is 10 nm to 100 nm. The thickness of the ud-InGaN layer 345 is 10 nm to 500 nm. The thickness of the ud-GaN layer 346 is 10 nm to 300 nm. The thickness of the n-type GaN layer 347 is 10 nm to 100 nm. These thickness values are merely examples. Other values may be used. The In composition ratios of the n-type AlInGaN layer 343, the n-type InGaN layer 344, and the ud-InGaN layer 345 are not limited but are preferably higher than 0 and lower than 0.0035, and more preferably, 0.001 to 0.003.

2. Effect of In

A potential barrier is formed by the In-doped of the n-type AlInGaN layer 343. Therefore, the existence probability of electrons and holes is low in the vicinity of threading dislocation. Non-radiative recombination is further suppressed in the threading dislocation. Moreover, the surface flatness of the semiconductor layer is improved by the surfactant effect of In atoms. Thereby, a semiconductor light-emitting device having superior emission is achieved.

What is claimed is:

1. A Group III nitride semiconductor light-emitting device comprising:
   an n-type semiconductor layer;
   a light-emitting layer on the n-type semiconductor layer;
   a p-type semiconductor layer on the light-emitting layer; and
   a plurality of pits extending from the n-type semiconductor layer to the p-type semiconductor layer,
   wherein the n-type semiconductor layer includes a semiconductor layer comprising an n-type GaN layer, a first n-type AlGaN layer, an ud-AlGaN layer, an ud-GaN layer, and an n-type GaN layer formed in this order on a side far from the light-emitting layer, and the first n-type AlGaN layer includes starting points of the pits.

2. The Group III nitride semiconductor light-emitting device according to claim 1, wherein the n-type semiconductor layer includes an n-side electrostatic breakdown preventing layer, the n-side electrostatic breakdown preventing layer includes the first n-type AlGaN layer, the light-emitting layer includes a barrier layer, and the Al composition ratio of the first n-type AlGaN layer is larger than the Al composition ratio of the barrier layer.

3. A Group III nitride semiconductor light-emitting device comprising:
   an n-type semiconductor layer;
   a light-emitting layer on the n-type semiconductor layer;
   a p-type semiconductor layer on the light-emitting layer; and
   a plurality of pits extending from the n-type semiconductor layer to the p-type semiconductor layer,
   wherein the n-type semiconductor layer includes a semiconductor layer comprising an n-type GaN layer, the first n-type AlGaN layer, an n-type AlInGaN layer, an ud-AlInGaN layer, an ud-InGaN layer, an ud-GaN layer, and an n-type GaN layer formed in this order on a side far from the light-emitting layer, and the first n-type AlGaN layer includes starting points of the pits.

4. The Group III nitride semiconductor light-emitting device according to claim 3, wherein the n-type semiconductor layer includes an n-side electrostatic breakdown preventing layer, the n-side electrostatic breakdown preventing layer includes the first n-type AlGaN layer, the light-emitting layer includes a barrier layer, and the Al composition ratio of the first n-type AlGaN layer is larger than the Al composition ratio of the barrier layer.

5. A Group III nitride semiconductor light-emitting device comprising:
an n-type semiconductor layer;
a light-emitting layer on the n-type semiconductor layer;
a p-type semiconductor layer on the light-emitting layer; and
a plurality of pits extending from the n-type semiconductor layer to the p-type semiconductor layer,
wherein the n-type semiconductor layer includes a semiconductor layer comprising an n-type GaN layer, the first n-type AlGaN layer, an n-type AlInGaN layer, an n-type InGaN layer, an ud-InGaN layer, an ud-GaN layer, and an n-type GaN layer formed in this order on a side far from the light-emitting layer, and the first n-type AlGaN layer includes starting points of the pits.

6. The Group III nitride semiconductor light-emitting device according to claim 5, wherein the n-type semiconductor layer includes an n-side electrostatic breakdown preventing layer, the n-side electrostatic breakdown preventing layer includes the first n-type AlGaN layer, the light-emitting layer includes a barrier layer, and the Al composition ratio of the first n-type AlGaN layer is larger than the Al composition ratio of the barrier layer.

7. The Group III nitride semiconductor light-emitting device according to claim 1, wherein the thickness of the first n-type AlGaN layer is within a range of 1 nm to 130 nm.

8. The Group III nitride semiconductor light-emitting device according to claim 3, wherein the thickness of the first n-type AlGaN layer is within a range of 1 nm to 130 nm.

9. The Group III nitride semiconductor light-emitting device according to claim 5, wherein the thickness of the first n-type AlGaN layer is within a range of 1 nm to 130 nm.

10. The Group III nitride semiconductor light-emitting device according to claim 2, wherein the thickness of the first n-type AlGaN layer is within a range of 1 nm to 130 nm.

11. The Group III nitride semiconductor light-emitting device according to claim 4, wherein the In composition ratios of the n-type AlInGaN layer, the ud-AlInGaN layer, and the ud-InGaN layer are higher than 0 and lower than 0.0035.

12. The Group III nitride semiconductor light-emitting device according to claim 6, wherein the In composition ratios of the n-type AlInGaN layer, the n-type InGaN layer, and the ud-InGaN layer are higher than 0 and lower than 0.0035.

13. The Group III nitride semiconductor light-emitting device according to claim 1, wherein the thickness of the ud-AlGaN layer is within a range of 50 nm to 500 nm.

14. The Group III nitride semiconductor light-emitting device according to claim 3, wherein the total thickness of the first n-type AlGaN layer, the n-type AlInGaN layer, and the ud-AlInGaN layer is 21 nm to 130 nm.

15. The Group III nitride semiconductor light-emitting device according to claim 5, wherein the total thickness of the first n-type AlGaN layer and the n-type AlInGaN layer is 6 nm to 130 nm.

16. The Group III nitride semiconductor light-emitting device according to claim 2, wherein the Al composition ratio of the first n-type AlGaN layer is in a range of 0.04 to 0.30 and the barrier layer of the light-emitting layer is in a range of 0.03 to 0.08.

17. The Group III nitride semiconductor light-emitting device according to claim 4, wherein the Al composition ratio of the first n-type AlGaN layer is in a range of 0.04 to 0.30 and the barrier layer of the light-emitting layer is in a range of 0.03 to 0.08.

18. The Group III nitride semiconductor light-emitting device according to claim 6, wherein the Al composition ratio of the first n-type AlGaN layer is in a range of 0.04 to 0.30 and the barrier layer of the light-emitting layer is in a range of 0.03 to 0.08.

* * * * *